(12) United States Patent
Chiu et al.

(10) Patent No.: US 6,348,740 B1
(45) Date of Patent: Feb. 19, 2002

(54) BUMP STRUCTURE WITH DOPANTS

(75) Inventors: Shih-Kuang Chiu; Ying Chou Tsai; Chao-Dung Suo, all of Taichung; Kuo-Liang Mao, Taichung Hsien, all of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/654,812

(22) Filed: Sep. 5, 2000

(51) Int. Cl.⁷ .................. H01L 23/48; H01L 23/52; H01L 29/40
(52) U.S. Cl. .................. 257/781; 257/781; 257/784
(58) Field of Search .................. 257/780, 781, 257/784

(56) References Cited

U.S. PATENT DOCUMENTS

| | | | |
|---|---|---|---|
| 5,436,503 A | * | 7/1995 | Kunitomo et al. |
| 5,461,261 A | * | 10/1995 | Nishiguchi |
| 6,005,292 A | * | 12/1999 | Roldan et al. |
| 6,153,938 A | * | 11/2000 | Kanda et al. |

* cited by examiner

Primary Examiner—Sheila V. Clark
(74) Attorney, Agent, or Firm—J. C. Patents

(57) ABSTRACT

A bump structure formed having dopants therein. The bump structure includes a substrate, a plurality of bonding pads, a die and a plurality of bumps. The substrate has a first surface. The plurality of bonding pads is formed on the first surface of the substrate. The die has an active surface. Each bump at least includes a base and a plurality of dopants. The bumps are formed on the active surface of the die. The active surface of the die faces the first surface of the substrate. The substrate and the die are aligned such that each bump on the die corresponds with a bonding pad on the substrate. Dopants in the bump structure are made to contact the bonding pads on the substrate.

8 Claims, 2 Drawing Sheets

BUMP STRUCTURE WITH DOPANTS

BACKGROUND OF THE INVENTION

1. Field of Invention

The present invention relates to a bump structure having dopants therein. More particularly, the present invention relates to the incorporation of dopants into the base material to fabricate the bump structure of a flip chip package.

2. Description of Related Art

In general, the fabrication of integrated circuit (IC) can be divided into three major stages, namely, the silicon wafer manufacturing stage, integrated circuit fabrication stage and integrated circuit packaging stage. The packaging stage is the last stage of semiconductor production. Besides protecting the die, the package serves as a medium for connecting the die with the printed circuit board (PCB) and other electronic devices.

Most electronic products are aiming towards lightweight, slim outline and small size. In other words, semiconductor devices inside these electronic products have to be highly integrated. In view of the trend, high-density packages such as chip scale packages (CSP) and flip chips (FC) are developed. In particular, a flip chip structure is employed in packages requiring a large number of pin connections such as a microprocessor. Because contact points in a flip-chip structure is arranged into an area array, pin density of the package is increased. Other advantages of flip-chip structure includes having self-aligned solder balls and short overall signal transmission paths.

FIGS. 1A and 1B are schematic cross-sectional views showing the structure of a conventional flip-chip package.

As shown in FIG. 1A, a flip-chip package consists of a substrate 102 and a die 106. Bonding pads 104 that serve as external contact points are formed over the substrate 102. The die 106 has an active surface 101. A plurality of bumps 108 is formed on the active surface 101 of the die 106.

As shown in FIG. 1B. the bumps 108 on the active surface 101 of the die 106 are aligned with bonding pads 104 on the substrate 102. In this assembly step, gaps 110 are often formed between some of the bumps and bonding pads 104. This may be the result of a variation of bump thickness on the die surface 110, variation of bonding pad thickness or insufficient planarity of the substrate 102. Even after a solder reflow operation, some of the bumps 108 still may not be able to contact their corresponding bonding pads 104. Packages with such out-of-contact bump 108 may have to be scrapped leading to yield loss.

To prevent the missing contact in a flip-chip package, presolder material identical to the material forming the bumps is often smeared onto the bonding pads of the substrate prior to bump attachment. However, such method complicates the manufacturing steps and increases cost of production.

SUMMARY OF THE INVENTION

Accordingly, one object of the present invention is to incorporate dopants into a base material to fabricate a bump structure so that difficulties in forming a good electrical contact between the bump and a bonding pad on an uneven substrate surface is minimized.

A second object of the invention is to incorporate dopants into a base material to fabricate the bump structure of a flip chip package so that difficulties in forming a good electrical contact between a bump and a bonding pad on an uneven substrate surface is minimized.

A third object of the invention is to provide a method of improving contact between a bump on a die and a bonding pad on a substrate in a flip chip package. The method includes forming a bump structure using a base material that contains dopants.

To achieve these and other advantages and in accordance with the purpose of the invention, as embodied and broadly described herein, the invention provides a bump structure having dopants therein. The bump structure includes a substrate, a plurality of bonding pads, a die and a plurality of bumps. The substrate has a first surface. The plurality of bonding pads is formed on the first surface of the substrate. The die has an active surface. Each bump at least includes a base material and a plurality of dopants. The bumps are formed on the active surface of the die. The active surface of the die faces the first surface of the substrate. The substrate and the die are aligned such that each bump on the die corresponds with a bonding pad on the substrate. Dopants in the bump structure are made to contact the bonding pads on the substrate.

According to the embodiment of this invention. dopants are added to soldering base material forming the bump structure. By controlling average size of the dopants, gaps between the bumps on the die and the bonding pads on the substrate can be easily eliminated. In other words, planarity of flip chip packages is improved. Just by adding some dopants into the material forming the bump, contact between the bumps and the bonding pads is strengthened. Since no additional step is required, there is no need to reschedule the manufacturing flow. Hence, the method can be implemented to increase yield of flip chip package without incurring additional cost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understading of the invention, and are incorporated in and constitute a part of this specification. The drawings illustrate embodiments of the invention and together with the description, serve to explain the principles of the invention. In the drawings.

DESCRIPTION OF THE PREFERRED EMBODIMENTS

Figure 1A:
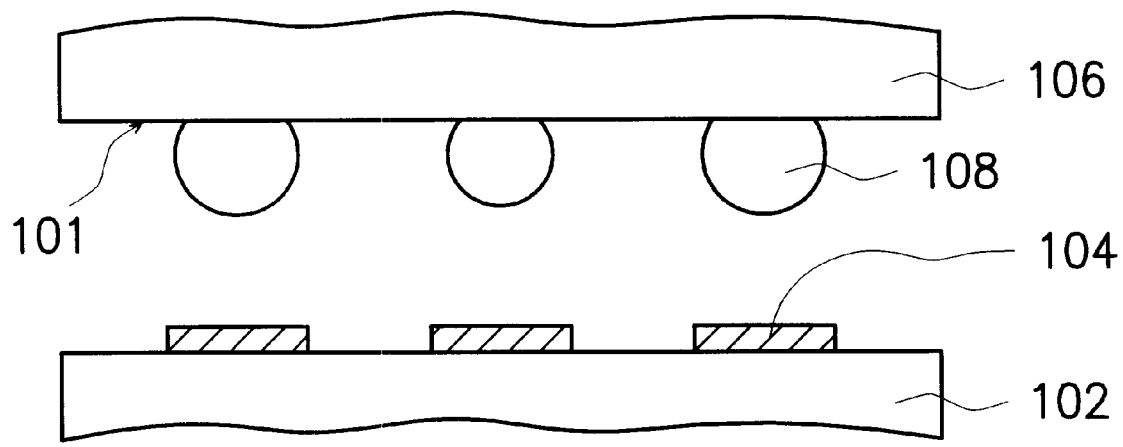
FIGS. 1A and 1B are schematic cross-sectional views showing the structure of a conventional flip-chip package.
Figure 1B:
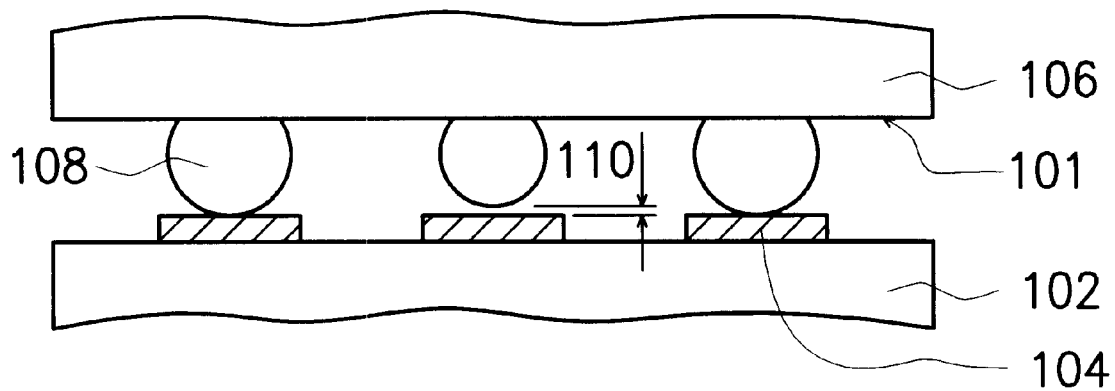

Reference will now be made in detail to the present preferred embodiments of the invention, examples of which are illustrated in the accompanying drawings. Wherever possible, the same reference numbers are used in the drawings and the description to refer to the same or like parts.

Figure 2A:
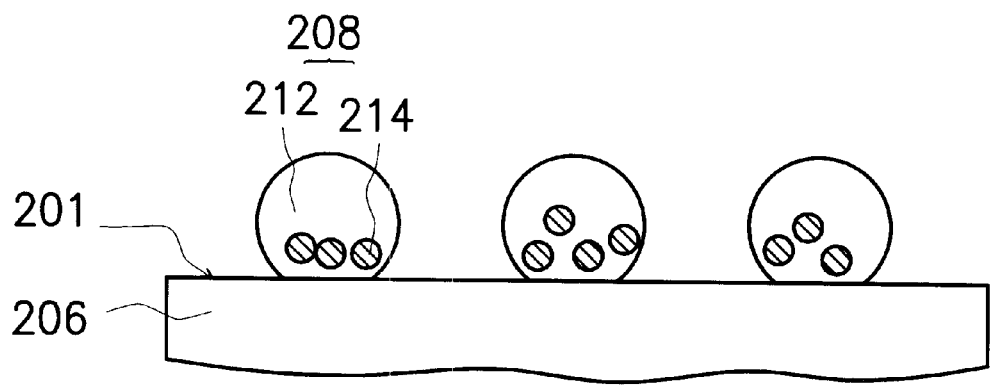
FIGS. 2A and 2B are schematic cross-sectional views showing a bump structure fabricated using a material having dopants therein according to this invention.
Figure 2B:
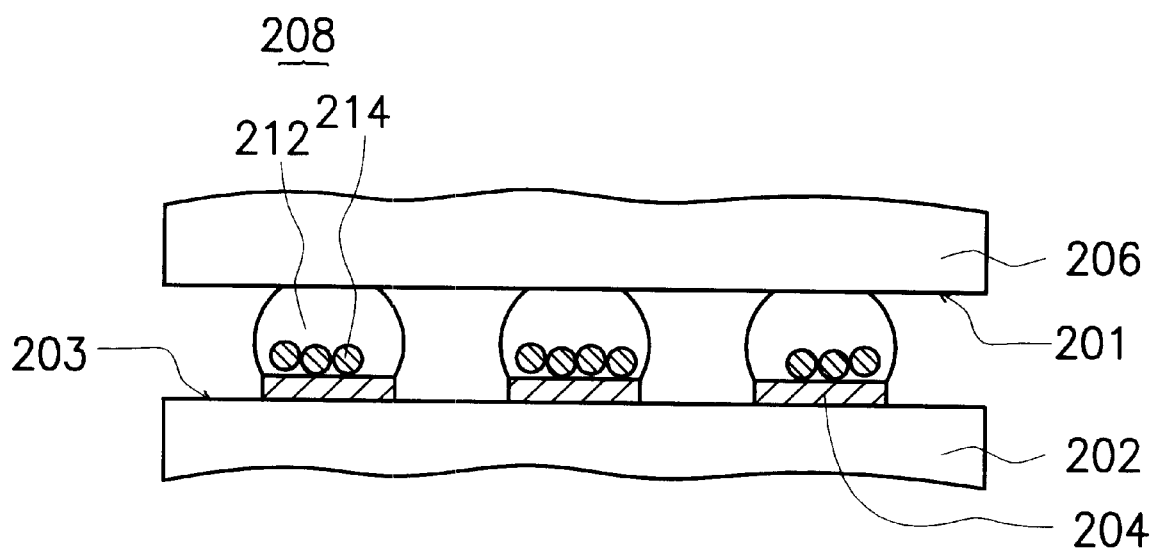

FIGS. 2A and 2B are schematic cross-sectional views showing a bump structure fabricated using a material having dopants therein according to this invention.

FIG. 2A shows a die 206 having an active surface 201. Bumps 208 are formed on the active surface 201 of the die 206. Each bump 208 is composed of base material 212 with some embedded dopants 214. Base material 212, for example, can be common crystalline tin-lead alloy, gold or conductive polymer. Embedded dopants 214, for example, can be silver-palladium alloy, heavy lead, copper or nickel. The base material 212 has a lower melting point than the dopants 214 inside the bumps 208. Furthermore, the base material 212 has lower relative density than the dopants 214. Melted and well-stirred base material 212 and the dopants 214 together can serves as solder for forming the bumps 208.

FIG. 2B is shows the die 206 in FIG. 2A mounted on top of a substrate 202. As shown in FIG. 2B, the substrate 202 has a first surface 203. A plurality of bonding pads 204 are formed on the first surface 203 of the substrate 202 serving as external contact point. The bonding pads 204 can be formed using a metallic material such as copper or aluminum. The active surface 201 of the die 206 faces the first surface 203 of the substrate 202. The die 206 and the substrate 202 are positioned such that each bump 208 on the die 206 corresponds to a bonding pad 204 on the substrate 202. In a solder reflow operation, the lower melting point base material 212 in the bump 208 first melts. Due to a higher relative density and a higher melting point of the dopants 214 relative to the base material 212, dopants 214 will drop down towards the bonding pads 204 of the substrate 202. Ultimately, wetting at the junction between the bump 208 and the bonding pad 104 will improve. By controlling the average diameter of the dopants 214, a better contact between the bumps and corresponding bonding pads 204 is achieved. Hence, gaps between the bumps 208 on the die 206 and the bonding pads 204 on the substrate 202 are eliminated. In other words, planarity of flip-chip package is improved so that more reliable and higher quality packages are formed. In addition, adding dopants 214 into the base material 212 is able to reinforce the junction between the bumps 208 and their corresponding bonding pads 204. Above all, there is no need to change or add any manufacturing step and hence the method can be easily implemented.

In summary, major advantages of forming the bump structure of this invention includes:

1. By adding dopants of a suitable size into solder material for forming the bump structure, gaps between the bumps on a die and their corresponding bonding pads on a substrate are eliminated. Hence, planarity of finished flip-chip package is improved.
2. There is no need to change or add any manufacturing steps to form the bump structure. The only change is to add some dopants to the base material. Hence, the invention can be easily implemented to form flip-chip packages.
3. The invention is able to improve planarity of flip-chip packages and raise assembly yield at a low production cost.
4. Junctions between the bumps and their corresponding bonding pads are strengthened so that a highly planar and reliable flip-chip package is produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump structure having dopants therein, comprising:
   a substrate having a first surface;
   a plurality of bonding pads formed on the first surface of the substrate;
   a die having an active surface; and
   a plurality of bumps composed of a base material and a plurality of dopants embedded within the base material, wherein the bumps are formed over the active surface of the die;
   wherein the substrate and the die are aligned in such a way that the active surface of the die faces the first surface of the substrate and that the dopants in each bump makes direct contact with a corresponding bonding pad on the substrate.

2. The bump structure of claim 1. wherein the base material of the bumps is selected from a group consisting of tin-lead alloy, gold and conductive polymer.

3. The bump structure of claim 2, wherein the base material constituting the bumps includes common crystalline tin-lead alloy.

4. The bump structure of claim 1, wherein the dopants inside the bumps is selected from a group consisting of silver-palladium alloy, heavy lead, copper and nickel.

5. The bump structure of claim 1, wherein relative density of the base material is smaller than relative density of the dopants.

6. The bump structure of claim 1, wherein melting point of the base material is lower than melting point of the dopants.

7. The bump structure of claim 1, wherein material constituting the bonding pads includes copper.

8. The bump structure of claim 1, wherein material constituting the bonding pads includes aluminum.

* * * * *